(12) United States Patent
Yasunishi et al.

(10) Patent No.: US 11,610,779 B2
(45) Date of Patent: Mar. 21, 2023

(54) METHOD FOR PRODUCING SEMICONDUCTOR DEVICE

(71) Applicant: TOYODA GOSEI CO., LTD., Kiyosu (JP)

(72) Inventors: Kota Yasunishi, Kiyosu (JP); Yukihisa Ueno, Kiyosu (JP)

(73) Assignee: TOYODA GOSEI CO., LTD., Kiyosu (JP)

( * ) Notice: Subject to any disclaimer, the term of this patent is extended or adjusted under 35 U.S.C. 154(b) by 0 days.

(21) Appl. No.: 17/158,694

(22) Filed: Jan. 26, 2021

(65) Prior Publication Data
US 2021/0257216 A1 Aug. 19, 2021

(30) Foreign Application Priority Data
Feb. 14, 2020 (JP) .............................. JP2020-023817

(51) Int. Cl.
*H01L 21/265* (2006.01)
*H01L 29/66* (2006.01)

(52) U.S. Cl.
CPC .. *H01L 21/26546* (2013.01); *H01L 29/66143* (2013.01); *H01L 29/66613* (2013.01)

(58) Field of Classification Search
CPC ........... H01L 21/3245; H01L 21/02112; H01L 21/28575; H01L 21/324; H01L 21/26553; H01L 21/3062; H01L 21/3105; H01L 21/385; H01L 21/2654; H01L 21/26546; H01L 21/2258; H01L 21/823418; H01L 21/823487; H01L 29/66143; H01L 29/66613; H01L 29/66666; H01L 29/66636; H01L 29/66696; H01L 29/66727; H01L 29/0619; H01L 29/66212; H01L 29/66712; H01L 29/66734; H01L 29/41766; H01L 29/4236; H01L 29/42352; H01L 29/66628; H01L 29/1095;
(Continued)

(56) References Cited

U.S. PATENT DOCUMENTS

| | | | |
|---|---|---|---|
| 7,161,208 B2 * | 1/2007 | Spring ................ | H01L 29/1095 257/E29.066 |
| 2008/0116512 A1 * | 5/2008 | Kawaguchi ....... | H01L 29/66734 257/334 |

(Continued)

FOREIGN PATENT DOCUMENTS

JP 2019-197751 A 11/2019

*Primary Examiner* — Natalia A Gondarenko
(74) *Attorney, Agent, or Firm* — McGinn I.P. Law Group, PLLC.

(57) ABSTRACT

An ion implanted region is formed by implanting Mg ions into a predetermined region of the surface of the first p-type layer. Subsequently, a second n-type layer is formed on the first p-type layer and the ion implanted region. A trench is formed by dry etching a predetermined region of the surface of the second n-type layer until reaching the first n-type layer. Next, heat treatment is performed to diffuse Mg. Thus, a p-type impurity region is formed in a region with a predetermined depth from the surface of the first n-type layer below the ion implanted region. Since the trench is formed before the heat treatment, Mg is not diffused laterally beyond the trench. Therefore, the width of the p-type impurity region is almost the same as the width of the first p-type layer divided by the trench.

6 Claims, 9 Drawing Sheets

(58) Field of Classification Search
CPC ............... H01L 29/2003; H01L 29/872; H01L 29/7802; H01L 29/7815; H01L 29/7813; H01L 29/78681–78696
USPC ...................... 438/478, 584; 257/76, 77, 192
See application file for complete search history.

(56) References Cited

U.S. PATENT DOCUMENTS

| | | | |
|---|---|---|---|
| 2018/0019322 A1* | 1/2018 | Takashima | H01L 21/0254 |
| 2018/0175147 A1* | 6/2018 | Ohse | H01L 29/0878 |
| 2018/0286945 A1* | 10/2018 | Oka | H01L 29/0623 |
| 2019/0341260 A1 | 11/2019 | Ueno et al. | |
| 2020/0303507 A1* | 9/2020 | Yilmaz | H01L 29/66348 |

\* cited by examiner

METHOD FOR PRODUCING SEMICONDUCTOR DEVICE

BACKGROUND OF THE INVENTION

Field of the Invention

The present invention relates to a Group III nitride semiconductor device and a production method therefor, more particularly, to a production method in which a p-type impurity region is formed by ion implantation.

Background Art

Japanese Patent Application Laid-Open (kokai) No. 2019-197751 discloses a method for forming a p-type impurity region in a predetermined region of the n-type layer in a structure having a semiconductor layer in which an n-type Group III nitride semiconductor layer and a p-type Group III nitride semiconductor layer are sequentially deposited.

Japanese Patent Application Laid-Open (kokai) No. 2019-197751 discloses that a p-type impurity region is formed as follows. Firstly, a p-type layer is formed on an n-type layer. Subsequently, an ion implanted region is formed in a predetermined region of the surface of the p-type layer by ion implantation of p-type impurity or n-type impurity. Next, the p-type impurity in the p-type layer is diffused by heat treatment into the n-type layer below the ion implanted region. Thus, a p-type impurity region is formed in the n-type layer below the ion implanted region.

However, it was found from the inventors' study that a p-type impurity region is formed in a horizontal direction of the ion implanted region as well as below the ion implanted region. Thus, a p-type impurity region is also formed in an unintended region.

SUMMARY OF THE INVENTION

In view of the foregoing, an object of the present invention is to form a p-type impurity region in an intended region of the n-type layer by ion implantation.

In an aspect of the present invention, there is provided a method for producing a semiconductor device having a substrate, a first n-type layer of n-type Group III nitride semiconductor on the substrate, and a first p-type layer of p-type Group III nitride semiconductor on the first n-type layer, the method comprising sequentially forming the first n-type layer and the first p-type layer on the substrate as a first step; forming an ion implanted region by ion implantation into the surface of the first p-type layer after the first step as a second step; forming a groove having a depth reaching the first n-type layer in a predetermined region of the surface of the first p-type layer and dividing the first p-type layer so that the ion implanted region is included in the divided first p-type layer after the second step as a third step; and forming a p-type impurity region in a region with a predetermined depth from the surface of the first n-type layer and a width of the first p-type layer below the ion implanted region by diffusing p-type impurity in the first p-type layer through heat treatment after the third step as a fourth step.

According to the present invention, a groove is formed before the heat treatment after the ion implantation, and therefore a p-type impurity region can be formed in an intended region.

BRIEF DESCRIPTION OF THE DRAWINGS

Various other objects, features, and many of the attendant advantages of the present invention will be readily appreciated as the same becomes better understood with reference to the following detailed description of the preferred embodiments when considered in connection with the accompanying drawings, in which.

DETAILED DESCRIPTION OF PREFERRED EMBODIMENTS

Specific embodiments of the present invention will next be described with reference to the drawings. However, the present invention is not limited to the embodiments.

First Embodiment

Figure 1:
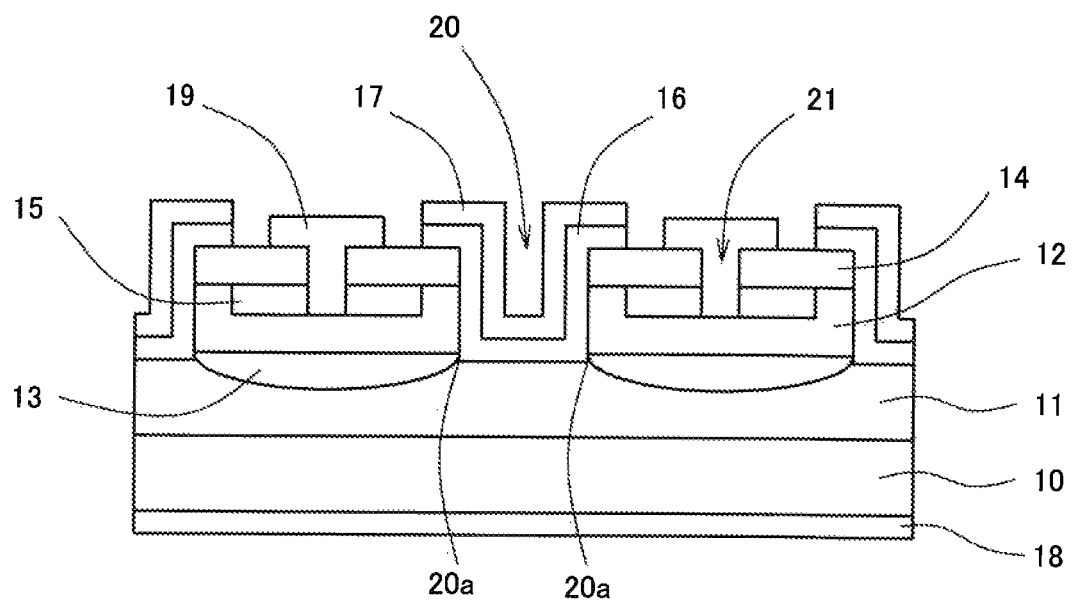
FIG. 1 shows the structure of a semiconductor device according to a first embodiment.

FIG. 1 shows the structure of a semiconductor device according to a first embodiment. The semiconductor device according to the first embodiment is a FET having a Group III nitride semiconductor trench, and includes a substrate 10, a first n-type layer 11, a first p-type layer 12, a p-type impurity region 13, a second n-type layer 14, an ion implanted region 15, a gate insulating film 16, a gate electrode 17, a drain electrode 18, and a source electrode 19 as shown in FIG. 1.

The substrate 10 is formed of Si-doped n-GaN. The material of the substrate 10 is not limited to GaN, and any conductive material can be employed as long as a Group III nitride semiconductor crystal can be grown thereon.

On the substrate 10, a first n-type layer 11 of n-GaN, a first p-type layer 12 of p-GaN, and a second n-type layer 14 of n-GaN are sequentially deposited. The impurity concentration of each layer is, for example, as follows. The Si concentration of the first n-type layer 11 is $1\times10^{15}/cm^3$ to $2.5\times10^{16}/cm^3$, the Mg concentration of the first p-type layer 12 is $1\times10^{17}/cm^3$ to $2\times10^{19}/cm^3$, and the Si concentration of the second n-type layer 14 is $1\times10^{18}/cm^3$ to $1\times10^{19}/cm^3$. The thickness of each layer is, for example, as follows. The thickness of the first n-type layer 11 is 10 μm, the thickness of the first p-type layer 12 is 1 μm, and the thickness of the second n-type layer 14 is 0.2 μm.

A trench 20 is formed in a predetermined region of the surface of the second n-type layer 14. The trench 20 is a groove having a depth passing through the second n-type layer 14 and the first p-type layer 12 and reaching the first n-type layer 11. The first n-type layer 11 is exposed on the bottom of the trench 20. The first p-type layer 12 and the second n-type layer 14 are exposed on the side surfaces of the trench 20. The trench 20 has a planar pattern such as honeycomb pattern, and the first p-type layer 12 and the second n-type layer 14 are divided by the regular hexagonal planar patterns. The width of the trench 20 is, for example, 0.5 μm to 5 μm, preferably 1.6 μm to 5 μm. The trench 20 may have any depth as long as the first n-type layer 11 is exposed. However, the depth of the trench is preferably 0.1 μm to 0.5 μm from the surface of the second n-type layer 14 so as to surely make the first n-type layer 11 exposed.

In the vicinity of the first p-type layer 12, the ion implanted region 15 is disposed. The ion implanted region 15 is a p-type region formed by implanting Mg ions into the surface of the first p-type layer 12 for forming a p-type impurity region 13. The side surfaces of the ion implanted region 15 are disposed inside the side surfaces of the first p-type layer 12, and the ion implanted region 15 is formed so as not to be exposed on the side surfaces of the trench 20. This is because the side surfaces of the trench 20 are device operation regions, and device operation may be adversely affected if the ion implanted region 15 damaged by ion implantation is exposed on the side surfaces of the trench 20.

The p-type impurity region 13 is disposed in a region in the vicinity of the surface of the first n-type layer 11 below the ion implanted region 15. The p-type impurity region 13 is a region formed by diffusion of Mg in the first p-type layer 12 and the ion implanted region 15. This p-type impurity region 13 can relax the electric field concentrated at corners 20a of the trench 20. The Mg concentration of the p-type impurity region 13 is, for example, $1\times10^{17}/cm^3$ to $2\times10^{18}/cm^3$. The deeper the depth of the p-type impurity region 13, the lower the Mg concentration. The bottom surface of the p-type impurity region 13 has a convex curved surface toward the substrate 10. The width of the p-type impurity region 13 is almost the same as the width of the first p-type layer 12 divided by the trench 20.

Figure 2:
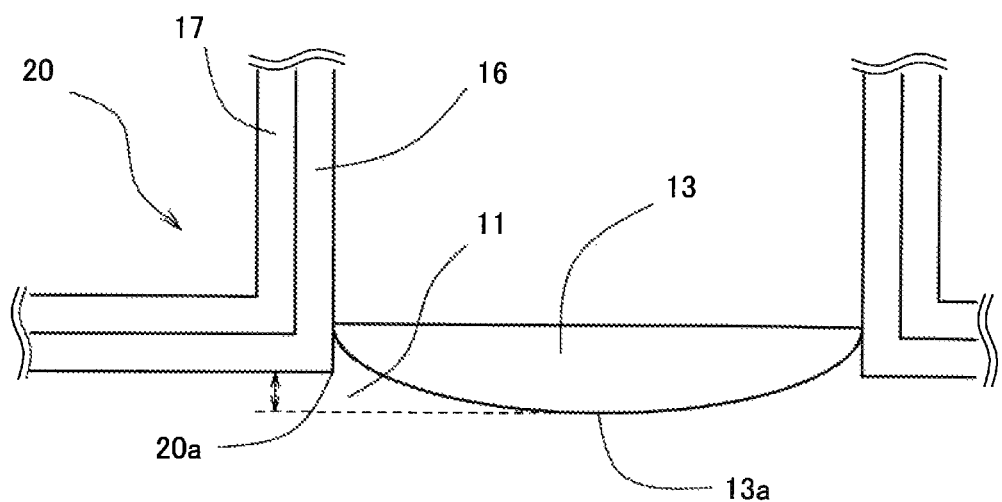
FIG. 2 is an enlarged view of a trench 20.

The p-type impurity region 13 may have any thickness. However, the thickness of the p-type impurity region 13 is preferably set as follows. The thickness is preferably set so that the corners 20a formed between the side surfaces and the bottom surface of the trench. 20 are not covered with the p-type impurity region 13 (refer to FIG. 2). When the corners 20a of the trench 20 are in contact with the first n-type layer 11, channel is easily formed at the corners 20a, thereby suppressing an increase in resistance. The corners 20a of the trench 20 may have a thickness so as to be in contact with the p-type impurity region 13. When the corners 20a are covered with the p-type impurity region 13, the electric field concentration at the corners 20a of the trench 20 can be more relaxed, thereby further improving the breakdown voltage and reliability. The lower surface 13a at the center (the thickest portion) of the p-type impurity region 13 is preferably disposed lower than the bottom surface of the trench 20 (closer to the substrate 10). This can further relax the electric field concentration at the corners 20a of the trench 20.

The gate insulating film 16 is formed in a film along the side surfaces, bottom surface, and top surface of the trench 20. Here, the top surface of the trench 20 refers to a region in the vicinity of the trench 20 of the surface of the second n-type layer 14. The gate insulating film 16 is formed of, for example, $SiO_2$.

The gate electrode 17 is formed in a film via the gate insulating film 16 along the side surfaces, bottom surface, and top surface of the trench 20. The gate electrode 17 is formed of, for example, Al.

The drain electrode 18 is formed on a backside of the substrate 10. The drain electrode 18 is formed of, for example, Ti/Al.

At the center in a plan view of the surface of the second n-type layer 14, a groove (recess) 21 having a depth passing through the second n-type layer 14 and the ion implanted region 15 and reaching the first p-type layer 12 is formed. The first p-type layer 12 is exposed on the bottom surface of the recess 21.

The source electrode 19 is formed continuously on the surface of the second n-type layer 14, the side surfaces and the bottom surface of the recess 21. The source electrode 19 is formed of, for example, Ti/Al. The source electrode 19 is in contact with not the ion implanted region 15 damaged by ion implantation but the first p-type layer 12 not damaged. Therefore, the contact resistance with the source electrode 19 can be reduced.

In the semiconductor device according to the first embodiment, the p-type impurity region 13 is formed only in an intended region, thereby achieving the device structure as designed. In the semiconductor device according to the first embodiment, the n-type region of the surface of the first p-type layer 12 is the second n-type layer 14 formed by not ion implantation but epitaxial growth. Therefore, the Si concentration is easily controlled, and higher concentration can be achieved. Since the second n-type layer 14 is not damaged by ion implantation, there is no risk of performance deterioration such as high resistance. Thus, the resistance can be reduced.

Next will be described processes for producing the semiconductor device according to the first embodiment with reference to the drawings.

Figure 3A:
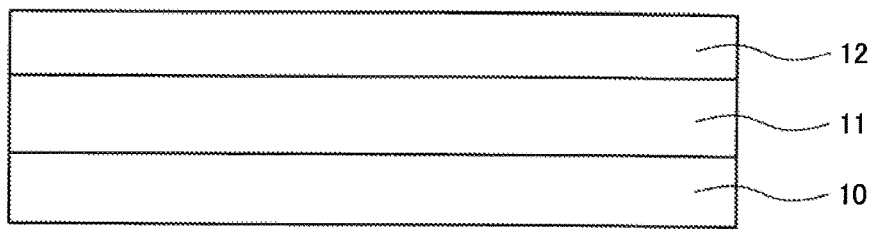
FIGS. 3A to 3E are sketches showing processes for producing the semiconductor device according to the first embodiment.

Firstly, a first n-type layer 11 of n-GaN and a first p-type layer 12 of p-GaN are sequentially deposited on an n-GaN substrate 10 through MOCVD (refer to FIG. 3A). Then, heat treatment is performed to activate Mg in the first p-type layer 12 and attain a p-type conduction.

Figure 3B:
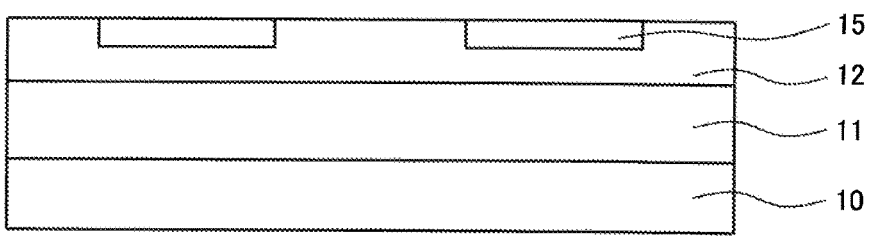

Subsequently, an AlN through film (not illustrated) is formed on the first p-type layer 12 through. MOCVD, and an ion implanted region 15 is formed by implanting Mg ions into the surface of the first p-type layer 12. The region being ion-implanted is disposed inside the region of the first p-type layer 12 being divided in the process after the next process. Photoresist may be employed as a mask for the region into which ions are not implanted. The through film is to control the amount of ion being implanted into the first p-type layer 12. Ion implantation is performed, for example, at a temperature of 500° C., an accelerating voltage of 230 keV, and a dose amount of $2.3\times10^{14}/cm^2$. After ion implantation, the through film and the mask are removed (refer to FIG. 3B).

Ions other than Mg may be implanted as long as they are p-type impurities. For example, Be ions may be implanted. Ion implantation may be performed a plurality of times, thereby favorably controlling the ion distribution in depth direction. Moreover, ion implantation may be performed in a direction forming an angle with respect to a direction perpendicular to the surface of the first p-type layer 12 while rotating the substrate 10. Thus, the width of the concentration distribution of the ions implanted in depth direction can be narrowed, and ions can be accurately implanted in a target position.

Figure 3C:
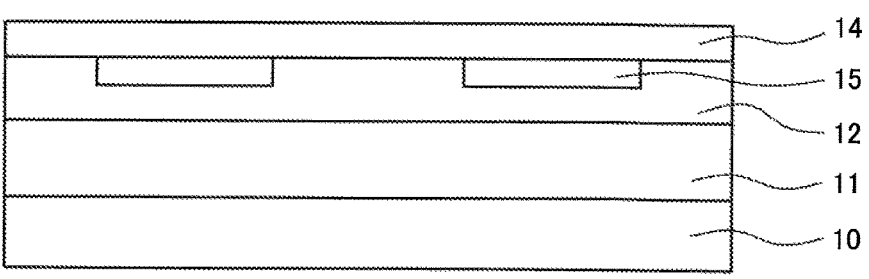

Subsequently, a second n-type layer 14 of n-GaN is formed on the first p-type layer 12 and the ion implanted region 15 through MOCVD (refer to FIG. 3C).

Figure 3D:
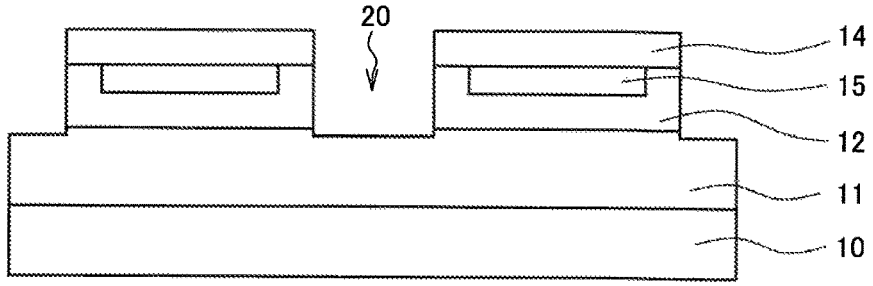

A trench 20 is formed by dry etching a predetermined region of the surface of the second n-type layer 14 until reaching the first n-type layer 11 (refer to FIG. 3D). The first p-type layer 12 is divided into predetermined regions by the trench 20, to remove the region of the first p-type layer 12 where the p-type impurity region 13 is not intended to be formed. Moreover, since the ion implanted region 15 is patterned to be disposed inside the region of the first p-type layer 12 being divided, the ion implanted region 15 is disposed inside the divided first p-type layer 12. Therefore, the ion implanted region 15 is not exposed on the side surfaces of the trench 20.

Figure 3E:
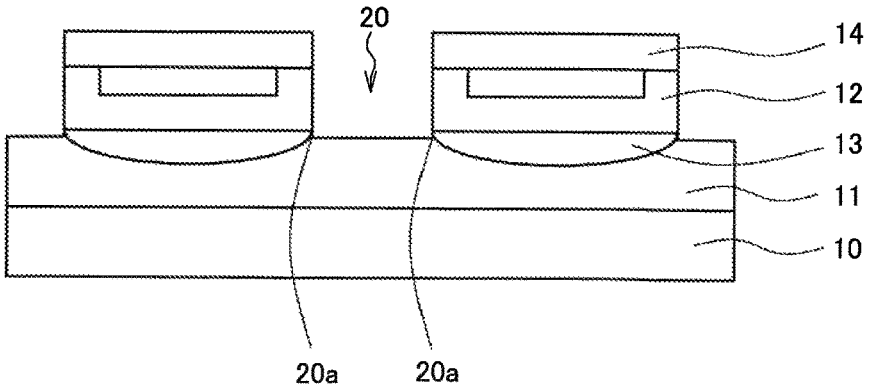

Next, a SiN protective film (not illustrated) is formed continuously on the second n-type layer 14, the side surfaces and the bottom surface of the trench 20, and heat treatment is performed. Heat treatment may be performed in any inert gas atmosphere such as nitrogen. The heat treatment is performed at a temperature of 1,000° C. to 1,100° C. for 5 to 120 minutes. Through this heat treatment, Mg contained in the first p-type layer 12 and the ion implanted region 15 is diffused into a region below the ion implanted region 15 on the surface side of the first n-type layer 11. Thus, a p-type impurity region 13 is formed in a region to a predetermined depth from the surface of the first n-type layer 11 below the ion implanted region 15. After that, the protective film is removed by hydrofluoric acid (refer to FIG. 3E).

Since the trench 20 is formed before the heat treatment, Mg is not diffused laterally beyond the trench 20. Therefore, the width of the p-type impurity region 13 is almost the same as the width of the first p-type layer 12 divided by the trench 20.

The closer to the side surface of the trench 20, the less diffusion of Mg to the substrate 10 side, and the farther from the side surface of the trench 20, the more diffusion of Mg to the substrate 10 side. As a result, the bottom surface of the p-type impurity region 13 has a convex curved surface toward the substrate 10.

The thickness of the p-type impurity region 13 can be controlled by the ion implantation condition, heat treatment condition, thickness of the first p-type layer 12, Mg concentration, and others. For example, the thickness of the p-type impurity region 13 can be increased by increasing the dosing amount in the ion implantation condition. Moreover, the thickness of the p-type impurity region 13 can be increased by increasing the heat treatment time in the heat treatment condition.

Corners 20a formed between the side surfaces and the bottom surface of the trench 20 are not preferably covered with the p-type impurity region 13 by controlling the thickness of the p-type impurity region 13. When the corners 20a of the trench 20 are in contact with the first n-type layer 11, channels are easily formed at those corners 20a, thereby suppressing an increase in resistance.

Alternatively, the corners 20a of the trench 20 are preferably in contact with the p-type impurity region 13. When the corners 20a are covered with the p-type impurity region. 13, the electric field concentration at the corners 20a of the trench 20 can be more relaxed, thereby further improving the breakdown voltage and reliability.

The thickest part of the p-type impurity region 13 is preferably closer to the substrate 10 than the bottom surface of the trench 20 by controlling the thickness of the p-type impurity region 13. Electric field concentration at the corners 20a of the trench 20 can be more relaxed.

Figure 4A:
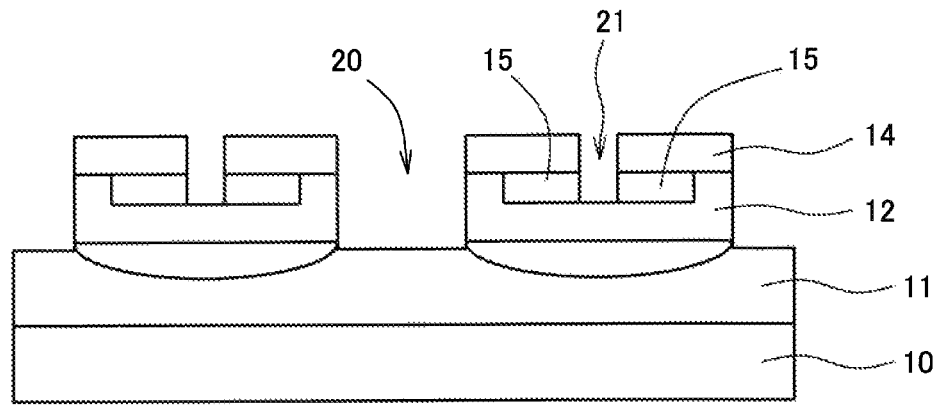
FIGS. 4A and 4B are sketches showing processes for producing the semiconductor device according to the first embodiment.

A recess 21 is formed by dry etching a predetermined region of the surface of the second n-type layer 14 until reaching the first p-type layer 12 (refer to FIG. 4A).

Figure 4B:
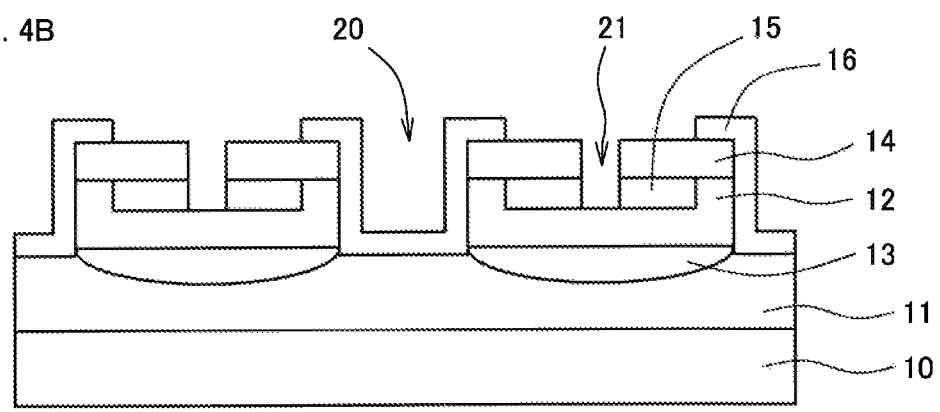

A gate insulating film 16 is formed in a film along the bottom surface, side surfaces, and top surface of the trench 20 through ALD (refer to FIG. 4B).

A source electrode 19 is formed continuously on the second n-type layer 14, the side surfaces of the recess 21, and the bottom surface of the recess 21 through vapor deposition or sputtering. Subsequently, a gate electrode 17 is formed via the gate insulating film 16 on the bottom surface, side surfaces, and top surface of the trench 20 through vapor deposition. A drain electrode 18 is formed on a backside of the substrate 10 through vapor deposition. Thus, the semiconductor device according to the first embodiment shown in FIG. 1 is produced.

According to the method for producing the semiconductor device according to the first embodiment, before the heat treatment after the ion implantation, the trench 20 having a depth reaching the first n-type layer 11 is formed, and the region of the first p-type layer 12 where the p-type impurity region 13 is not intended to be formed is removed. Therefore, Mg in the first p-type layer 12 and the ion implanted region 15 is prevented from being diffused laterally beyond the trench 20. As a result, the p-type impurity region 13 can be formed in an intended region, thereby achieving the device structure as designed.

VARIATIONS OF FIRST EMBODIMENT

Variations of the semiconductor device according to the first embodiment will be described with reference to the drawings.

Variation 1-1

Figure 5:
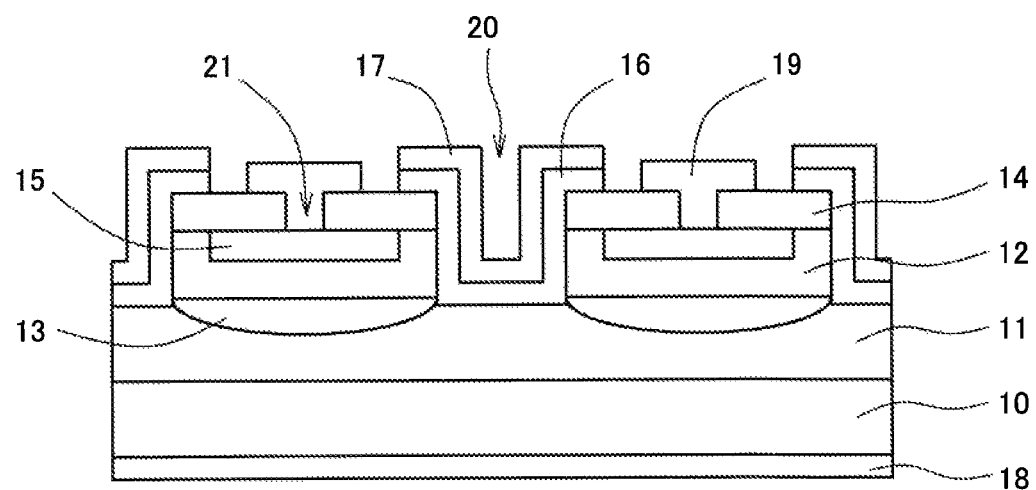
FIG. 5 shows the structure of a semiconductor device according to a variation 1-1.

The recess 21 may have any depth as long as the p-type region is exposed on the bottom surface thereof. Therefore, as shown in FIG. 5, the recess 21 may be shallowed so as to have such a depth that the ion implanted region 15 is exposed on the bottom surface thereof. However, as described in the first embodiment, the ion implanted region 15 may be damaged due to ion implantation, and the contact resistance between the source electrode 19 and the ion implanted region 15 may be increased. Therefore, the recess 21 preferably has such a depth as to expose the first p-type layer 12.

Variation 1-2

Figure 6:
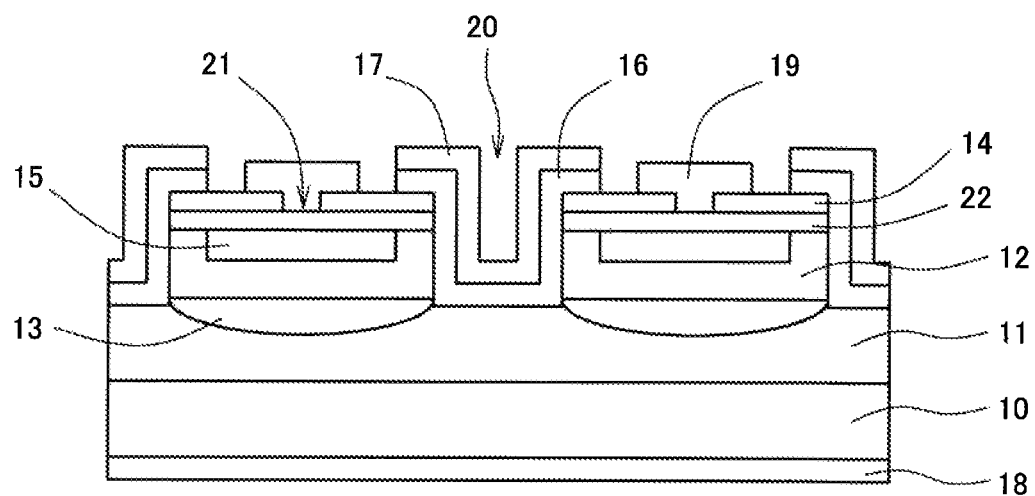
FIG. 6 shows the structure of a semiconductor device according to a variation 1-2.

As shown in FIG. 6, a second p-type layer 22 may be formed between the first p-type layer 12 and the second re-type layer 14, and the recess 21 may have such a depth as to expose the second p-type layer 22. Thus, the source electrode 19 can be brought into contact with the second p-type layer 22 not damaged by ion implantation, thereby reducing the contact resistance.

Variation 1-3

Figure 7:
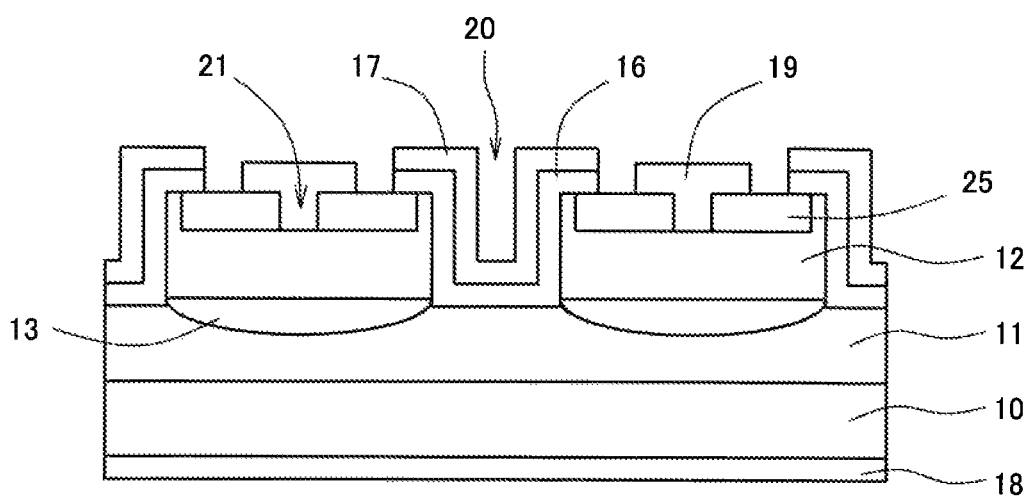
FIG. 7 shows the structure of a semiconductor device according to a variation 1-3.

As shown in FIG. 7, when an n-type ion implanted region 25 is formed instead of the p-type ion implanted region 15 by ion implantation of n-type impurity such as Si instead of Mg, the second n-type layer 14 can be omitted, and the device structure can be more simplified, thereby reducing the production cost. Even when the n-type ion implanted region 25 is formed, the impurity region therebelow is not n-type but the p-type impurity region 13 same as in the first embodiment.

Variation 1-4

Figure 8:
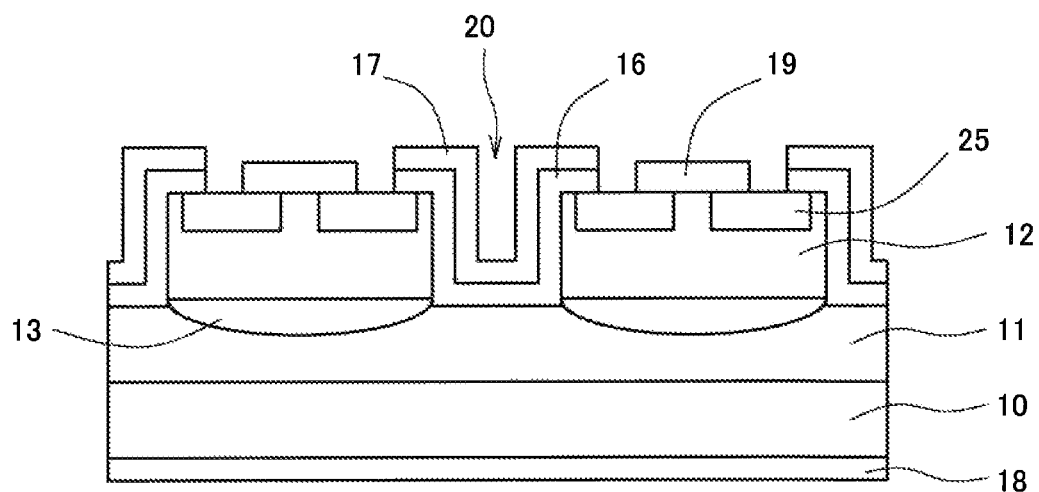
FIG. 8 shows the structure of a semiconductor device according to a variation 1-4.

In case of variation 1-3, as shown in FIG. 8, a region where the n-type impurity is not ion-implanted is left on the surface of the first p-type layer 12, and a source electrode 19 may be formed continuously on the surface of the left first p-type layer 12 and the ion implanted region 25. Since the recess 21 is not required, the device structure can be more simplified, thereby reducing the production cost. Moreover, no steps are formed by the recess 21, thereby improving accuracy of the photomask pattern when the source electrode 19 is formed. As a result, there is no risk of coating failure of the source electrode 19.

Variation 1-5

Figure 9:
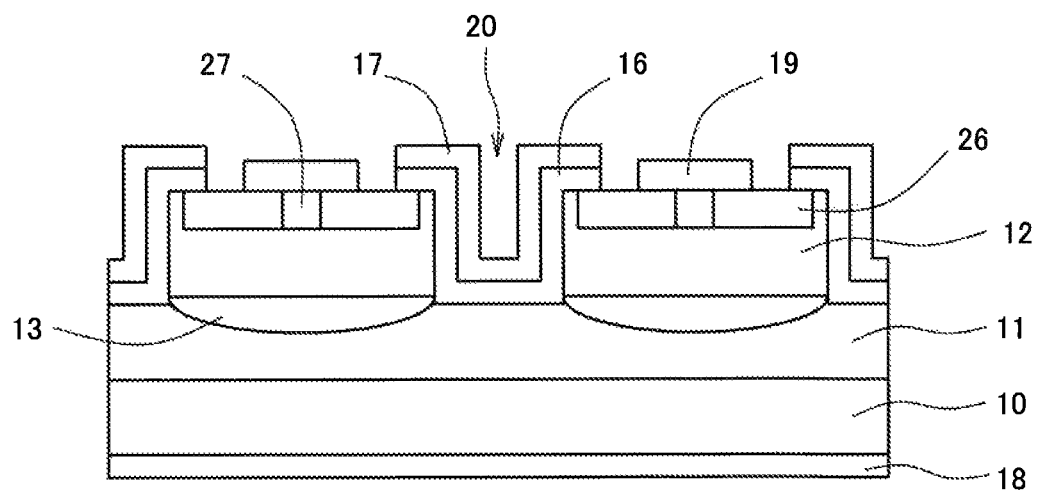
FIG. 9 shows the structure of a semiconductor device according to a variation 1-5.

In case of variation 1-3, as shown in FIG. 9, an n-type ion implanted region 26 and a p-type ion implanted region 27 are formed by performing two ion implantation processes of n-type impurity and p-type impurity into the surface of the first p-type layer 12, and a source electrode 19 may be formed continuously on those ion implanted regions 26 and 27. The ion implanted region 27 with a high acceptor concentration can be formed by controlling the Mg concentration of the p-type ion implanted region 27, thereby reducing the contact resistance. Since the recess 21 is not required, the same effect as in variation 1-4 can be attained.

Second Embodiment

Figure 10:
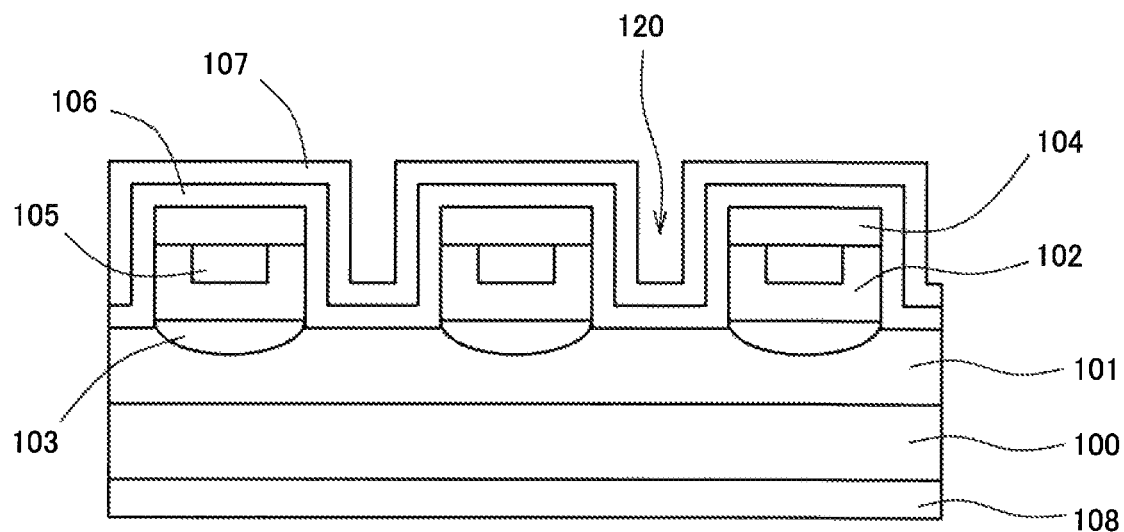
FIG. 10 shows a structure of a semiconductor device according to a second embodiment.

FIG. 10 shows a structure of a semiconductor device according to a second embodiment. The semiconductor device according to the second embodiment is a Group III nitride semiconductor SBD (Schottky Barrier Diode) having a MPS (Merged PIN Schottky) structure, which includes a substrate 100, an n-type layer 101, a first p-type layer 102, a p-type impurity region 103, a second p-type layer 104, an ion implanted region 105, a first electrode 106, a second electrode 107, a backside electrode 108.

The substrate 100 is formed of Si-doped n-GaN. The material of the substrate 100 is not limited to GaN, and any conductive material may be used as long as Group III nitride semiconductor can be epitaxially grown thereon.

On the substrate 100, an n-type layer 101 of n-GaN, a first p-type layer 102 of p-GaN, and a second p-type layer 104 of p-GaN are sequentially deposited. The Mg concentration of the second p-type layer 104 is set higher than the Mg concentration of the first p-type layer 102. For example, the Mg concentration of the first p-type layer 102 is $1\times10^{17}/cm^3$ to $2\times10^{19}/cm^3$, and the Mg concentration of the second p-type layer 104 is $1\times10^{18}/cm^3$ to $5\times10^{20}/cm^3$.

A groove 120 is formed in a predetermined region of the surface of the second n-type layer 104. The groove 120 is a groove having a depth passing through the second p-type layer 104 and the first p-type layer 102, and reaching the n-type layer 101. The first p-type layer 102 and the second p-type layer 104 are divided into a plurality of regions by this groove 120.

In the vicinity of the first p-type layer 102, the ion implanted region 105 is disposed. The ion implanted region 105 is a p-type region formed by implanting Mg ions into the surface of the first p-type layer 102 for forming a p-type impurity region 103. The side surfaces of the ion implanted region 105 are disposed inside the side surfaces of the first p-type layer 102, and the ion implanted region 105 is formed so as not to be exposed on the side surfaces of the groove 120. However, the ion implanted region 105 may be exposed on the side surfaces of the groove 120.

The p-type impurity region 103 is disposed in a region in the vicinity of the surface of the n-type layer 101 below the ion implanted region 105. The p-type impurity region 103 is a region formed by diffusion of Mg in the first p-type layer 102 and the ion implanted region 105. This p-type impurity region 103 can relax the electric field concentrated at corners of the groove 120, thereby further suppressing leakage current when a reverse bias is applied. The Mg concentration of the p-type impurity region 103 is, for example, $1\times10^{17}/cm^3$ to $2\times10^{18}/cm^3$. The deeper the p-type impurity region 103, the lower the Mg concentration. The bottom surface of the p-type impurity region 103 has a convex curved surface toward the substrate 100. The width of the p-type impurity region 103 is almost the same as the width of the first p-type layer 102 divided by the groove 120.

Figure 11:
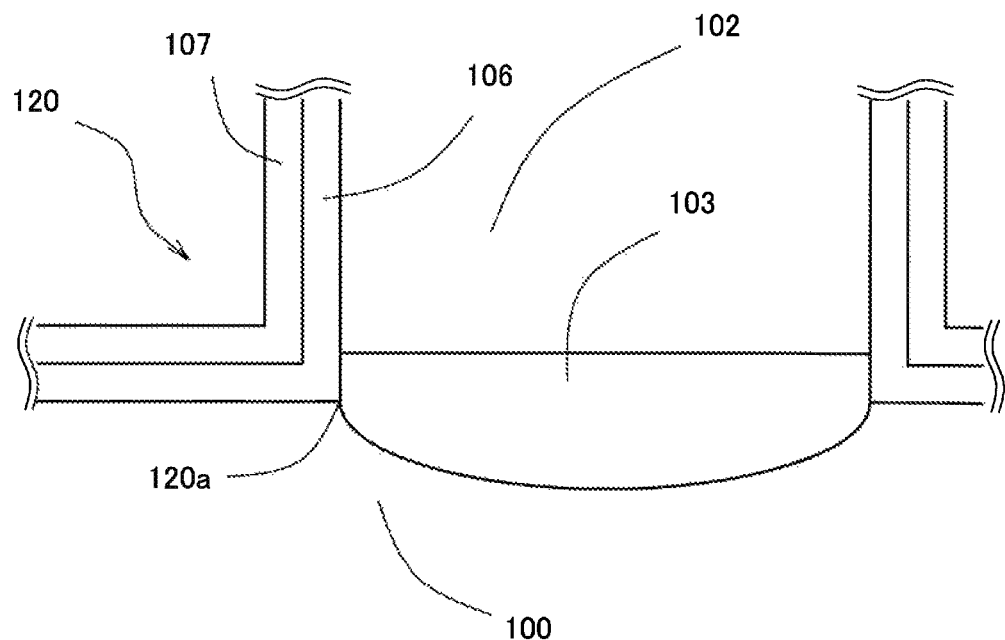
FIG. 11 is an enlarged view of a groove 120.

The p-type impurity region 103 may have any thickness. However, the thickness of the p-type impurity region 103 is preferably set so that the corners 120a formed between the side surfaces and the bottom surface of the groove 120 are in contact with the p-type impurity region 103 (FIG. 11). The electric field concentration at the corner 120 can be more suppressed.

The first electrode 106 is formed in a film along the surface of the second p-type layer 104, the side surfaces and the bottom surface of the groove 120. The first electrode 106 is formed of a material which forms Schottky junction with the n-type layer 101, for example, Ni, Pd, W.

The second electrode 107 is formed in a film along the unevenness on the first electrode 106. The second electrode 107 is formed of, for example, Al.

The backside electrode 108 is formed on a backside of the substrate 100. The backside electrode 108 is formed of a material which forms an ohmic contact with the substrate 100, for example, Ti/Al.

In the semiconductor device according to the second embodiment, the p-type impurity region 103 is formed only in an intended region so that the device structure can be achieved as designed. In the semiconductor device according to the second embodiment, the top surface of the semiconductor layer is the second p-type layer 104 formed by epitaxial growth. Therefore, the Mg concentration is easily controlled so that a high concentration can be achieved. Since the second p-type layer 104 is not damaged by ion implantation, there is no risk of device performance deterioration such as high resistance. Thus, the resistance of the semiconductor device can be reduced.

Next will be described processes for producing the semiconductor device according to the second embodiment with reference to the drawings.

Figure 12A:
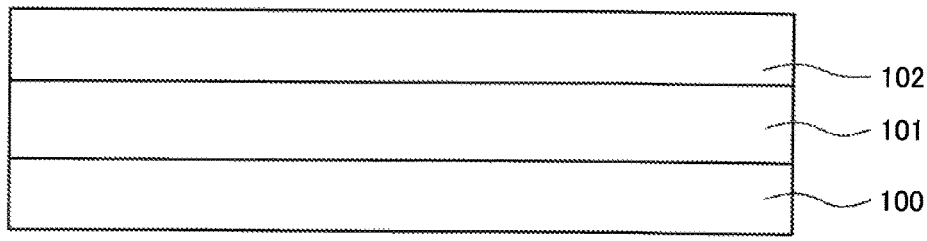
FIGS. 12A to 12E are sketches showing processes for producing the semiconductor device according to the second embodiment.

Firstly, an n-GaN n-type layer 101 and a p-GaN first p-type layer 102 are sequentially deposited on an n-GaN substrate 100 through MOCVD (refer to FIG. 12A). Then, heat treatment is performed to activate Mg in the first p-type layer 102 and attain a p-type conduction.

Figure 12B:
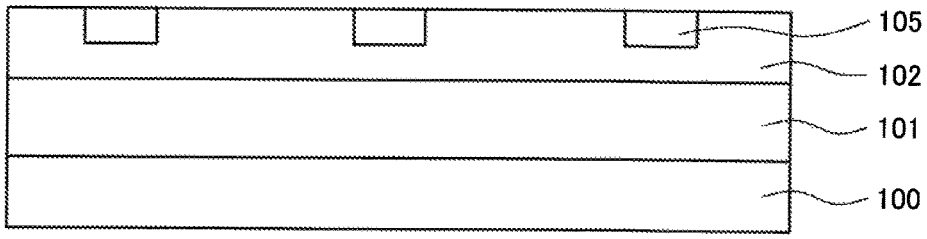
Figure 12C:
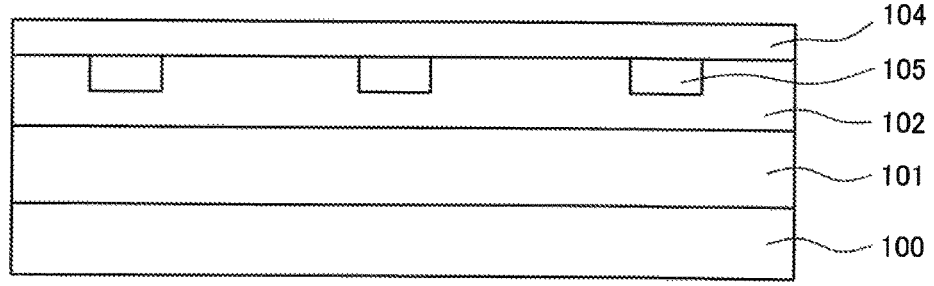
Figure 12D:
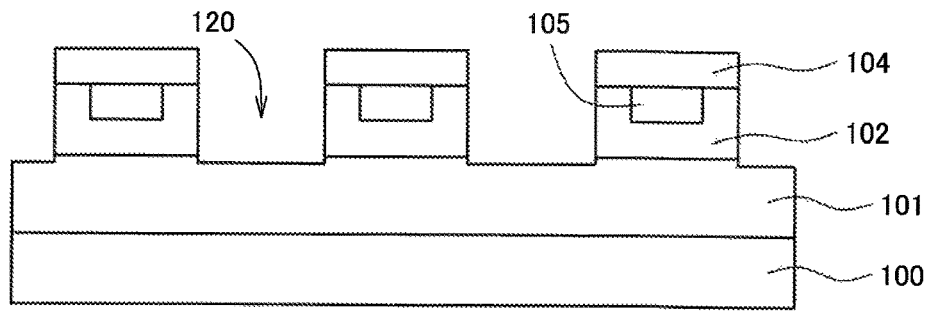

Subsequently, an AlN through film (not illustrated) is formed on the first p-type layer 102 through MOCVD, and an ion implanted region 105 is formed by implanting Mg ions into a predetermined region of the surface of the first p-type layer 102. Photoresist may be used as a mask for the region into which ions are not implanted. The regions being ion-implanted or the ion implantation conditions are the same as in the first embodiment. After ion implantation, the through film and the mask are removed (refer to FIG. 12B).

Figure 13:
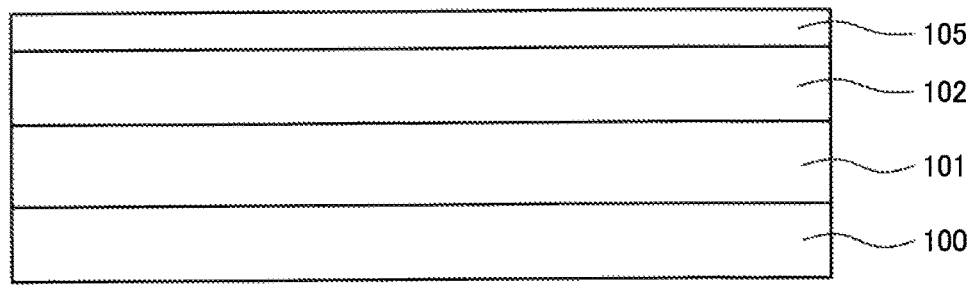
FIG. 13 shows a variation of the production processes.

Ions may be implanted into the entire surface of the first p-type layer 102 without limiting the region being ion-implanted by the mask (refer to FIG. 13).

Subsequently, a p-GaN second p-type layer 104 is formed through MOCVD on the first p-type layer 102 and the ion implanted region 105, (refer to FIG. 12O).

A groove 120 is formed by dry etching a predetermined region of the surface of the second p-type layer 104 until reaching the n-type layer 101 (refer to FIG. 12O). The first p-type layer 102 and the second p-type layer 104 are divided by the groove 120 to remove the first p-type layer 102 and the second p-type layer 104 of the region where a p-type impurity region 103 is not intended to be formed.

Figure 12E:
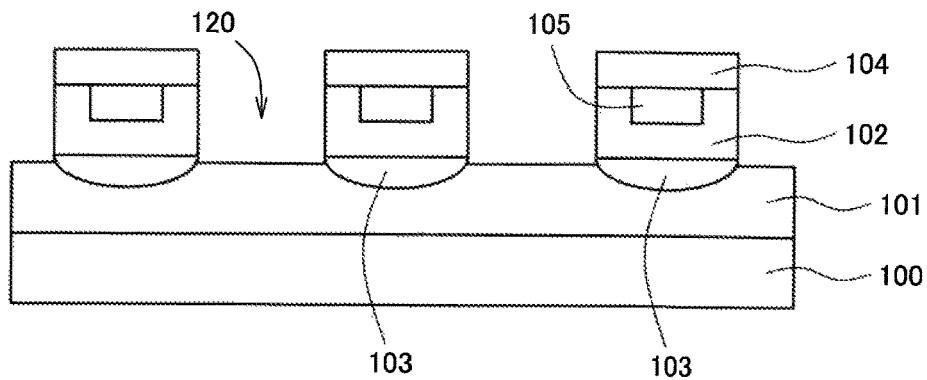

Next, a. SiN protective film. (not illustrated) is continuously formed on the second p-type layer 104, the side surfaces and the bottom surface of the groove 120, and heat treatment is performed. The heat treatment conditions are the same as in the first embodiment. Through this heat treatment, Mg contained in the first p-type layer 102 and the ion implanted region 105 is diffused into a region below the ion implanted region 105 on the surface side of the first n-type layer 101. Thus, a p-type impurity region 103 is formed in a region to a predetermined depth from the surface of the first n-type layer 101 below the ion implanted region 105. After that, the protective film is removed by hydrofluoric acid (refer to FIG. 12E).

Since the groove 120 is formed before the heat treatment, Mg is not diffused laterally beyond the groove 120. Therefore, the width of the p-type impurity region 103 is almost the same as the width of the first p-type layer 102 being divided by the groove 120.

The bottom surface of the p-type impurity region 103 has a convex curved surface toward the substrate 100 for the same reason as in the first embodiment.

The corners 120a formed between the side surfaces and the bottom surface of the groove 120 are preferably in contact with the p-type impurity region 103 by controlling the thickness of the p-type impurity region 103. This can further relax the electric field concentration at the corners 120a of the groove 120. The thickness of the p-type impurity region 103 can be controlled in the same way as when the thickness of the p-type impurity region 13 is controlled in the first embodiment.

Subsequently, first electrode 106 and a second electrode 107 are sequentially formed along the side surfaces and the bottom surface of the groove 120 on the second p-type layer 104. Moreover, a backside electrode 108 is formed on a back side of the substrate 100. Thus, the semiconductor device according to the second embodiment shown in FIG. 10 is produced.

According to the method for producing the semiconductor device according to the second embodiment, before the heat treatment after the ion implantation, the groove 120 having a depth reaching the n-type layer 101 is formed, and the region of the first p-type layer 102 where the p-type impurity region 103 is not intended to be formed is removed. Therefore, Mg in the first p-type layer 102 and the ion implanted region 105 is prevented from being diffused laterally beyond the groove 120. As a result, the p-type impurity region 103 can be formed in an intended region, thereby achieving the device structure as designed.

VARIATIONS OF SECOND EMBODIMENT

Next will be described variations of the semiconductor device according to the second embodiment.

Variation 2-1

Figure 14:
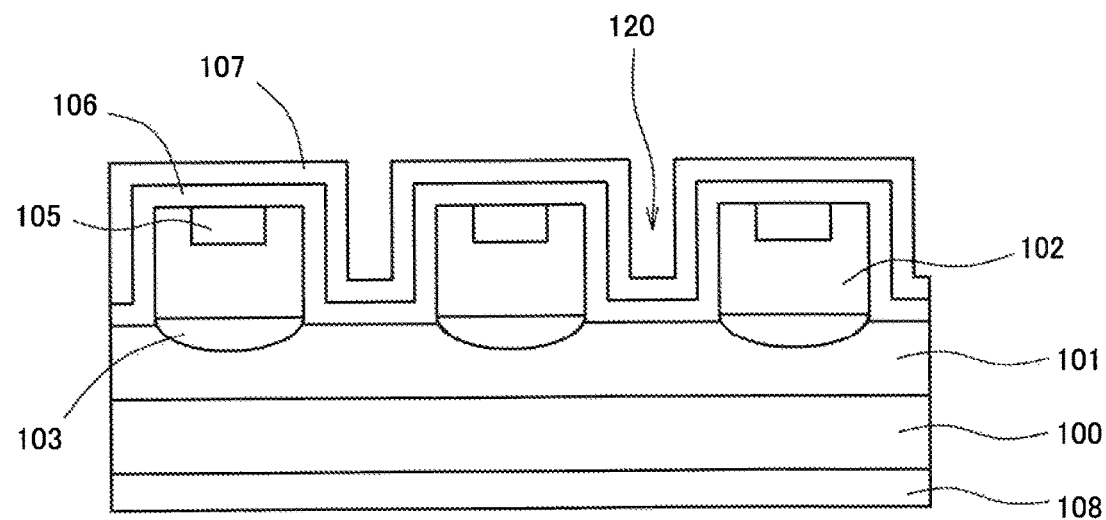
FIG. 14 shows a structure of a semiconductor device according to a variation 2-1.

In the semiconductor device according to the second embodiment, as shown in FIG. 14, the second p-type layer 104 may be omitted. The device structure can be more simplified, thereby reducing the production cost. In this case, the contact resistance with the first electrode 106 might be increased. Therefore, the Mg concentration of the first p-type layer 102 or the ion implanted region 105 is preferably higher than in the second embodiment.

Variation 2-2

Figure 15:
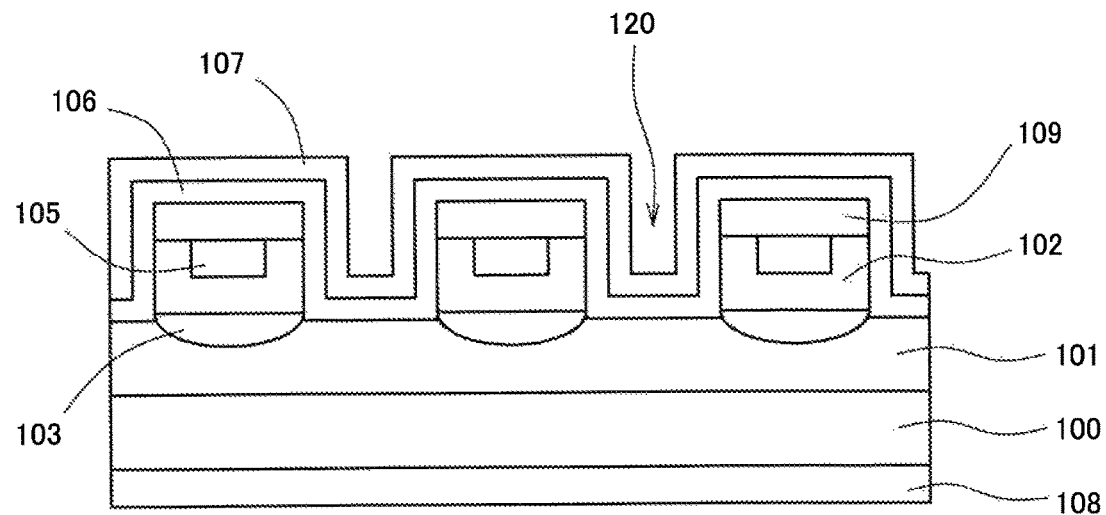
FIG. 15 shows a structure of a semiconductor device according to a variation 2-2.

In variation 2-1, as shown in FIG. 15, a fourth electrode 109 may be separately formed between the first electrode 106 and the ion implanted region 105, or between the first electrode 106 and the first p-type layer 102. The first electrode 106 being in contact with the n-type layer 101 and the fourth electrode 109 being in contact with the first p-type layers 102 and the ion implanted region 105 can be respectively suitably designed, thereby increasing design flexibility. The fourth electrode 109 is preferably formed of a material capable of forming an ohmic contact with p-GaN, for example, Ni and Pd. Variation 2-2 may be applied to the second embodiment as well. The fourth electrode 109 may be formed between the first electrode 106 and the second p-type layer 104.

Variation 2-3

Figure 16:
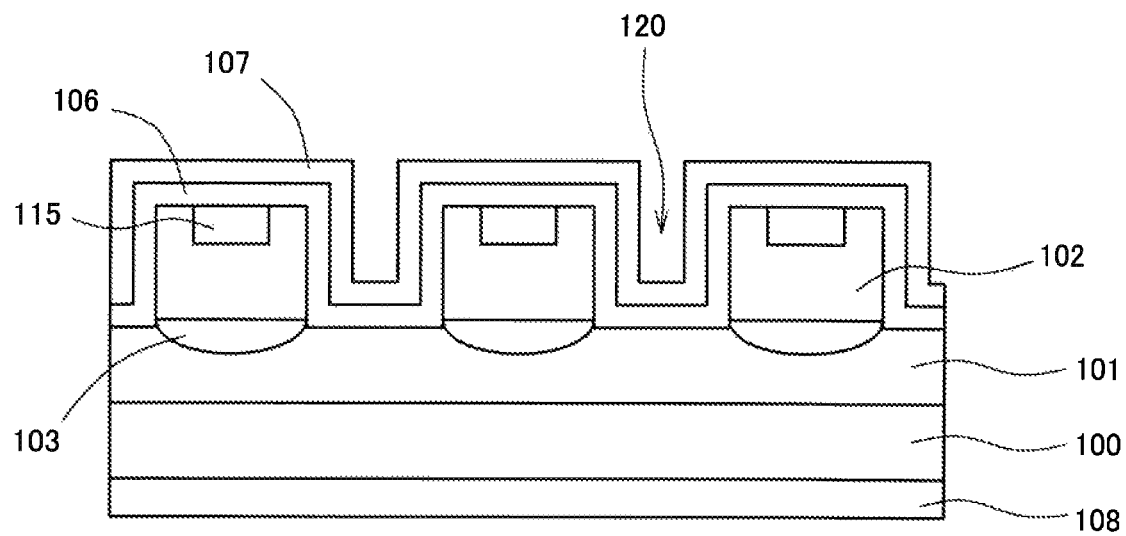
FIG. 16 shows a structure of a semiconductor device according to a variation 2-3.

In the semiconductor device according to the variation 2-1, as shown in FIG. 16, an n-type ion implanted region 115 may be formed instead of the p-type ion implanted region 105 by ion implantation of n-type impurity such as Si instead of p-type impurity. The Mg concentration of the first p-type layer 102 or the ion implanted region 105 may be lowered than in variation 2-1. Thus, an SBD (Schottky Barrier Diode) having a JBS (Junction Barrier Schottky) structure can be achieved.

Other Variations

Figure 17:
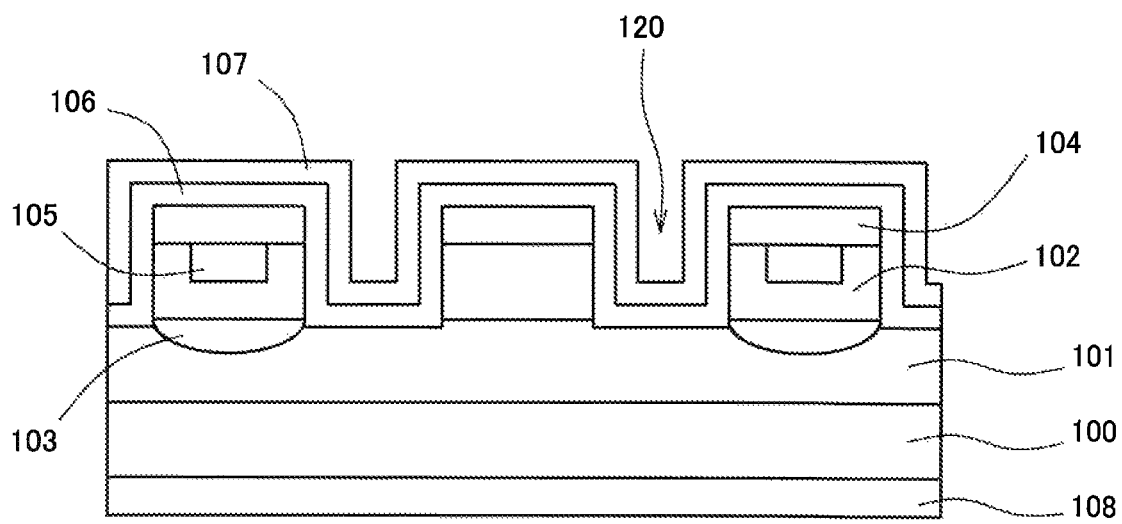
FIG. 17 shows a structure of a semiconductor device according to other variation.

In the first and second embodiments, the first p-type layer is divided into regular hexagonal planar patterns by the groove. However, any pattern such as rectangle, other polygon, circle, or a combination of these can be used. The larger the area of the first p-type layer or the ion implanted region, the more the thickness of the p-type impurity region can be increased, thereby designing the breakdown voltage or resistance of the device for each planar pattern. A p-type impurity region is not necessarily formed on every divided first p-type layers. For example, a p-type impurity region may be formed on every other divided first p-type layers so as not to be adjacent to each other. A p-type impurity region may be formed on every third divided first p-type layers. A p-type impurity region may be randomly formed. A region for facilitating current flow or a region for ensuring the breakdown voltage can be intentionally designed, thereby increasing flexibility of device design. FIG. 17 shows an example where a p-type impurity region is formed on every other divided first p-type layers in the second embodiment.

The semiconductor devices according to the first and second embodiments are a GaN semiconductor device. However, the present invention is not limited to a GaN semiconductor device, and may be applied to a semiconductor device formed of Group III nitride semiconductor such as AlGaN, InGaN, and AlGaInN.

The semiconductor device according to the first embodiment is a FET having a trench gate structure, and the semiconductor device according to the second embodiment is an SBD having a MPS structure or JBS structure. However, the present invention is not limited to devices having those structures.

The semiconductor device of the present invention is suitable for power devices.

What is claimed is:

1. A method for producing a semiconductor device having a substrate, a first n-type layer of n-type Group III nitride semiconductor on the substrate, a first p-type layer of p-type Group III nitride semiconductor on the first n-type layer, and a second n-type layer of n-type Group III nitride semiconductor on the first p-type layer, the method comprising:
   sequentially forming the first n-type layer and the first p-type layer as a first step;
   forming ion implanted regions by ion implantation into a surface of the first p-type layer after the first step as a second step;
   forming the second n-type layer on the ion implanted regions and the first p-type layer except the ion implanted regions, and forming a groove having a depth reaching the first n-type layer in a predetermined region of a surface of the second n-type layer after the second step as a third step, the first p-type layer and the second n-type layer being divided by the groove into regular hexagonal planar patterns, each of the ion implanted regions being included in each of the regular hexagonal planar patterns, the predetermined region being an area outside of each of the ion implanted regions and not contacting with each of the ion implanted regions; and
   forming respective p-type impurity regions in the respective regular hexagonal planar patterns with a predetermined depth from an interface between the first n-type layer and the first p-type layer below the ion implanted regions by diffusing p-type impurity in the first p-type layer through heat treatment after the third step as a fourth step, wherein a width of the p-type impurity region is almost the same as a width of the first p-type layer, and
   wherein the semiconductor device is a FET having a trench gate structure with the groove as a trench, the trench including a gate insulating film formed on a bottom surface and a side surface of the trench and the gate insulating film being not contacting with the ion implanted regions, and
   wherein the p-type impurity regions are formed so as not to cover corners of the gate insulating film.

2. The method for producing the semiconductor device according to claim 1, wherein the ion implantation in the second step is performed into a region inside the first p-type layer being divided in the third step.

3. A method for producing a semiconductor device having a substrate, a first n-type layer of n-type Group III nitride semiconductor on the substrate, a first p-type layer of p-type Group III nitride semiconductor on the first n-type layer, and a second n-type layer of n-type Group III nitride semiconductor on the first p-type layer, the method comprising:
   sequentially forming the first n-type layer and the first p-type layer as a first step;
   forming ion implanted regions by ion implantation into a surface of the first p-type layer after the first step as a second step;
   forming the second n-type layer on the ion implanted regions and the first p-type layer except the ion implanted regions, and forming a groove having a depth reaching the first n-type layer in a predetermined region of a surface of the second n-type layer after the second step as a third step, the first p-type layer and the second n-type layer being divided by the groove into regular hexagonal planar patterns, each of the ion implanted regions being included in each of the regular hexagonal planar patterns, the predetermined region being an area outside of each of the ion implanted regions and not contacting with each of the ion implanted regions;
   forming respective p-type impurity regions in the respective regular hexagonal planar patterns with a predetermined depth from an interface between the first n-type layer and the first p-type layer below each of the ion implanted regions by diffusing p-type impurity in the first p-type layer through heat treatment after the third step as a fourth step, wherein a width of the p-type impurity region is almost the same as a width of the first p-type layer, and
   wherein the semiconductor device is a PET having a trench gate structure with the groove as a trench, the trench including a gate insulating film formed on a bottom surface and a side surface of the trench and the gate insulating film being not contacting with the ion implanted regions, and
   wherein the p-type impurity regions are formed so as to be in contact with corners of the gate insulating film.

4. The method for producing the semiconductor device according to claim 3, wherein the ion implantation in the second step is performed into a region inside the first p-type layer being divided in the third step.

5. The method for producing the semiconductor device according to claim 1, wherein the first n-type layer is n-type GaN doped with Si, the first p-type layer is p-type GaN doped with Mg, the second n-type layer is n-type GaN doped with Si, the ion for implantation is Mg, and the p-type impurity regions have a convex curved surface toward the substrate.

6. The method for producing the semiconductor device according to claim 3, wherein the first n-type layer is n-type GaN doped with Si, the first p-type layer is p-type GaN doped with Mg, the second n-type layer is n-type GaN doped with Si, the ion for implantation is Mg, and the p-type impurity region has a convex curved surface toward the substrate.

* * * * *